United States Patent [19]

Swartz

[11] 4,443,651
[45] Apr. 17, 1984

[54] SERIES CONNECTED SOLAR CELLS ON A SINGLE SUBSTRATE

[75] Inventor: George A. Swartz, North Brunswick, N.J.

[73] Assignee: RCA Corporation, New York, N.Y.

[21] Appl. No.: 450,223

[22] Filed: Dec. 16, 1982

Related U.S. Application Data

[63] Continuation of Ser. No. 249,729, Mar. 31, 1981, abandoned.

[51] Int. Cl.³ .................... H01L 31/06; H01L 31/18
[52] U.S. Cl. .................................. 136/249; 29/572; 136/258; 136/244; 357/30
[58] Field of Search ........ 136/244, 249 MS, 258 AM; 29/572; 357/30

[56] References Cited

U.S. PATENT DOCUMENTS

| | | | |
|---|---|---|---|
| 4,042,418 | 8/1977 | Biter | 136/249 |
| 4,064,521 | 12/1977 | Carlson | 357/2 |
| 4,142,195 | 2/1979 | Carlson et al. | 357/15 |
| 4,162,505 | 7/1979 | Hanak | 357/30 |
| 4,163,677 | 8/1979 | Carlson et al. | 136/255 |
| 4,292,092 | 9/1981 | Hanak | 148/1.5 |
| 4,313,022 | 1/1982 | Jordan et al. | 136/244 |
| 4,315,096 | 2/1982 | Tyan et al. | 136/244 |
| 4,316,049 | 2/1982 | Hanak | 136/244 |
| 4,334,120 | 6/1982 | Yamano et al. | 136/248 |

FOREIGN PATENT DOCUMENTS

| | | | |
|---|---|---|---|
| 1351454 | 5/1974 | United Kingdom | 136/244 |
| 1538650 | 1/1979 | United Kingdom | 357/23 |

OTHER PUBLICATIONS

Y. Kuwano et al., Properties of Amorphous Si-H and Si-F-H Films and Its Photovoltaic Characteristics, *Extended Abstracts, The Electrochemical Society*, vol. 80-2, pp. 1421-1422.

Y. Kuwano, Amorphous Silicon Solar Cell and Integrated Cell Module, *JEE*, Nov., 1980, pp. 72-78.

W. J. Biter et al., An Automatable Integrated Thin Film Solar Cell Array, *Conf. Record 12th, IEEE Photovoltaic Specialists Conference*, Nov., 1976, pp. 466-470.

J. J. Hanak, Monolithic Solar Cell Panel of Amorphous Silicon, *Solar Energy*, vol. 23, 1979, pp. 145-147.

*Primary Examiner*—Aaron Weisstuch
*Attorney, Agent, or Firm*—Birgit E. Morris; Donald S. Cohen; William J. Burke

[57] ABSTRACT

Series connected amorphous silicon solar cells which are formed on a single substrate are described. Also described are methods of inexpensively forming such series connected amorphous silicon solar cells.

9 Claims, 7 Drawing Figures

SERIES CONNECTED SOLAR CELLS ON A SINGLE SUBSTRATE

This is a continuation of application Ser. No. 249,729, filed Mar. 31, 1981, abandoned.

BACKGROUND OF THE INVENTION

The present invention relates to solar cells. It has particular application to series connected amorphous silicon solar cells which are formed on a single substrate.

In order to convert solar energy into electrical energy, solar cells are used. Such cells may be formed of various semiconductor materials, such as amorphous silicon. In order for solar cells to become available for general use, it is necessary that the formation of such solar cells into arrays, comprising a plurality of cells, be made possible at a relatively low cost to the consuming public. As a typical amorphous silicon solar cell produces approximately one volt of electricity when exposed to the sun, such cells will have to be connected in series in order to build up thier voltages in order that their outputs may be used either directly or transferred into storage devices, such as batteries, for indirect use. The process of connecting solar cells in series can be a labor intensive one. Accordingly, such a process would ordinarily be very expensive to perform.

SUMMARY OF THE INVENTION

The present invention provides an automatic method of producing series connected solar cells, such as amorphous silicon solar cells. The cells are produced as series connected arrays as a consequence of the manufacturing method. Such arrays may be produced to have a desired output voltage without requiring labor intensive operations.

In accordance with the present invention, a solar cell array comprises a plurality of adjacent, series connected solar cells on a single insulating substrate wherein adjacent cells are connected together by spiking a metal interelectrode connection from the electrode on top of one cell through the amorphous silicon layer to the electrode on the bottom of the next adjacent cell.

DETAILED DESCRIPTION OF EXEMPLARY EMBODIMENTS

Figure 1:
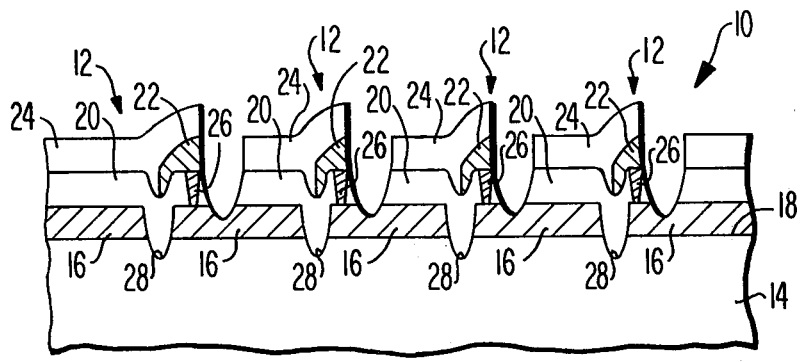
FIG. 1 illustrates a first embodiment of a solar cell of the type manufactured in accordance with the present invention.

Referring now to FIG. 1, a solar array 10 comprised of a plurality of solar cells 12 is shown. The solar cells 12 are formed on a substrate 14 which is comprised of glass, or other, similar transparent material, in the present embodiment of the invention. A series of metal electrodes 16, comprised of molybdenum in the preferred embodiment of the invention, although any other suitable metal could be used, is on a surface 18 of the glass substrate 14. Silicon semiconductor portions 20 of the cells 12 overlie the molybdenum electrodes 16 on the glass substrate 14. In the preferred embodiment of the invention, the semiconductor portions 20 are comprised of amorphous silicon. A series of metal electrodes 22, which are comprised of a metal such as aluminum, copper, or gold, overlie both the top surface of the amorphous silicon 20 of one cell 12 and at least part of the electrode 16 of the next adjacent cell. Overlying the electrodes 22 is a transparent, conductive material, such as indium-tin-oxide (ITO) 24, for reasons which will be explained hereinafter.

There are also interelectrode connections 26 between the electrodes 22 on the top surface of the amorphous silicon layers 20 and the electrodes 16 on the glass substrate 14. The method of forming the connections 26 will be described hereinafter.

As can be seen, there is an electrical series connection which exists between the ITO electrode 24, the top metal electrode 22, the interelectrode connection 26, and the molybdenum electrode 16. Thus, each ITO electrode 24, at the top of a cell 12, makes electrical contact to the bottom electrode 16 of the adjacent cell 12 to the right of the cell 12 over which the ITO electrode 24 lies. It should be noted, however, that the amorphous silicon portions 20 must have a low conductivity, such that the connection made by the semiconductor layer 20 between electrodes 16 can be ignored.

The amorphous silicon portions 20 of each cell 12 are connected in series such that the top of each amorphous silicon layer 20 makes electrical contact to the bottom of the adjacent amorphous silicon layer 20 to its right as viewed in FIG. 1.

The number of series connected cells 12 in a particular array is determined by the voltage requirements for a particular application.

Figure 2:
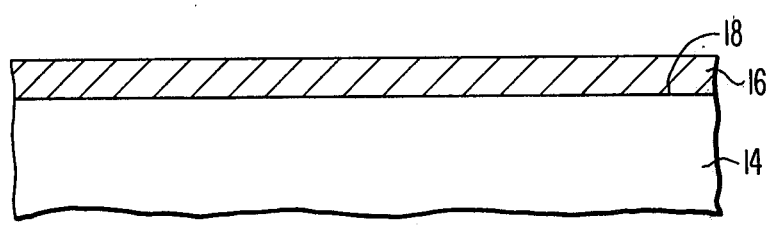
FIGS. 2–4 illustrate the method of manufacturing the solar cell of FIG. 1.
Figure 3:
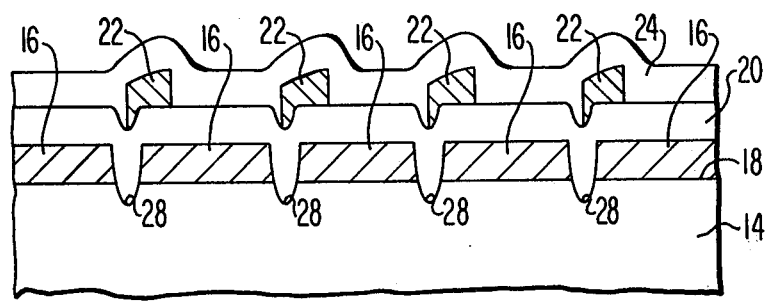
Figure 4:
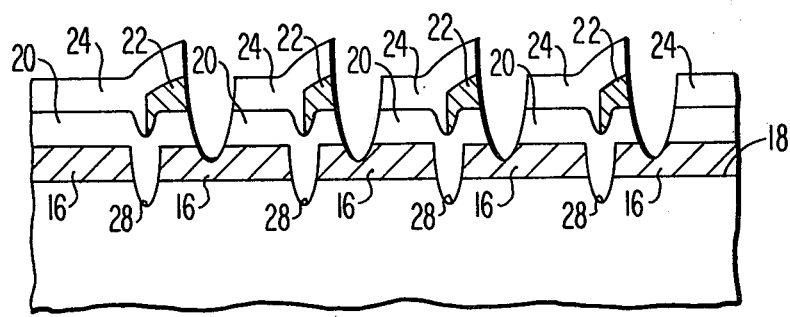

Referring now to FIGS. 2-4, the method for manufacturing the series connected cells 12 of FIG. 1 will be explained. With reference to FIG. 2, one starts with a substrate 14, such as a glass substrate, upon which a conductive layer 16, which is comprised of molybdenum in the preferred embodiment of the invention, is applied. The conductive layer 16 may be applied by any desired technique, such as by evaporation. Following the deposition of the conductive layer 16 on the substrate 14, the conductive layer 16 is scribed in order to make it discontinuous as shown in FIG. 3. The scribing of the conductive layer 16 can be accomplished by any means, such as by laser scribing, in which case the scribe lines 28 may extend into the glass substrate 14 as shown. Following the scribing of the conductive layer 16, an amorphous silicon layer 20 is deposited on the surface of the scribed metal layer 16.

As is well known in the art, the amorphous silicon layer 20 will typically comprise a three-part structure having P, I, and N type semiconductor material. However, in the present invention the amorphous silicon layer 20 may have only I and N type semiconductor material and a Schottky barrier. In view of the fact that either the P type material or the N type material can be on the surface of the amorphous silicon layer 20 which is exposed to incident radiation, for the purpose of describing the present invention, the amorphous silicon layer 20 will simply be referred to as a layer. However, those of ordinary skill in the art will recognize that the manner of manufacturing the structures known in the art are well known and more fully described in U.S. Pat. No. 4,064,521 entitled SEMICONDUCTOR DEVICE HAVING A BODY OF AMORPHOUS SILICON which issued on Dec. 20, 1977 to D. E. Carlson; U.S. Pat. No. 4,142,195 entitled SCHOTTKY BARRIER SEMICONDUCTOR DEVICE AND METHOD OF MAKING SAME which issued on Feb. 27, 1979 to D. E. Carlson et al.; U.S. Pat. No. 4,162,505 entitled INVERTED AMORPHOUS SILICON SOLAR CELL UTILIZING CERMENT LAYERS which issued on July 24, 1979 to J. J. Hanak; and U.S. Pat. No. 4,163,677 entitled SCHOTTKY BARRIER AMORPHOUS SILICON SOLAR CELL WITH THIN DOPED REGION ADJACENT METAL SCHOTTKY BARRIER which issued on Aug. 7, 1979 to D. E. Carlson et al. Each of the foregoing U.S. patents are incorporated herein by reference for the purpose of explaining the manner in which the amorphous silicon layer 20 can be manufactured and for the purpose of describing the composition of the amorphous silicon layer 20.

With continued reference to FIG. 3, conductive metal stripes 22 are applied over the surface of the amorphous silicon layer 20 by any convenient technique. Thus, the metal stripes 22 may be evaporated onto the surface of the amorphous silicon layer 20 through a mask. Alternatively, the stripes 22 can be formed using a photolithographic method of the type commonly known in the art or by a "paint and peel" method of the type to be more fully described hereinafter. The metal stripes 22 are comprised of a metal, such as aluminum, copper, or gold, which can be spiked through the amorphous silicon layer 20 in the manner which will be described more fully hereinafter.

Following the application of the metal stripes 22, a conductive layer 24 is applied over the surface of the device. The conductive layer 24 must be comprised of a material selected so that it is transparent to incident radiation if the upper surface of the amorphous silicon layer 20 is to receive light. Accordingly, a material such as indium-tin-oxide (ITO) is typically used for the layer 24. Following the application of the conductive layer 24 the structure is again subjected to a scribing process, such as a laser scribing, in order to cut through the conductive layer 24 thereby making it discontinuous, as shown in FIG. 4. In view of the fact that ITO layers of the type used in the manufacture of amorphous silicon solar cells are typically on the order of a few hundred Angstroms thick, a laser scribe of the ITO layer 24 will typically cut through the amorphous silicon layer 20, as shown. However, as will be seen hereinafter, it is not necessary for the laser scribe to cut entirely, or even partially, through the amorphous silicon layer 20 as long at it serves to cut entirely through the ITO layer 24 so that the ITO layer 24 is electrically discontinuous.

Next, the device is subjected to an annealing process in which it is heated for a time and to a temperature sufficient to cause the metal stripes 22 to generate spikes 26 through the amorphous silicon layer 20 to electrically connect the ITO layer 24 to the underlying metal electrodes 16, as shown in FIG. 1. The time and temperature of the annealing will be determined by the particular material used for the metal stripes 22, and the thickness of the amorphous silicon layer 20. By way of example, if copper is used, an anneal at 260° C. for thirty minutes can be used. A longer anneal at a lower temperature or a shorter one at a higher temperature would, of course, have the same results. Following the annealing procedure, the device 10, as shown in FIG. 1, will be completed, and there will be a series connection between the amorphous silicon solar cells 12.

Figure 5:
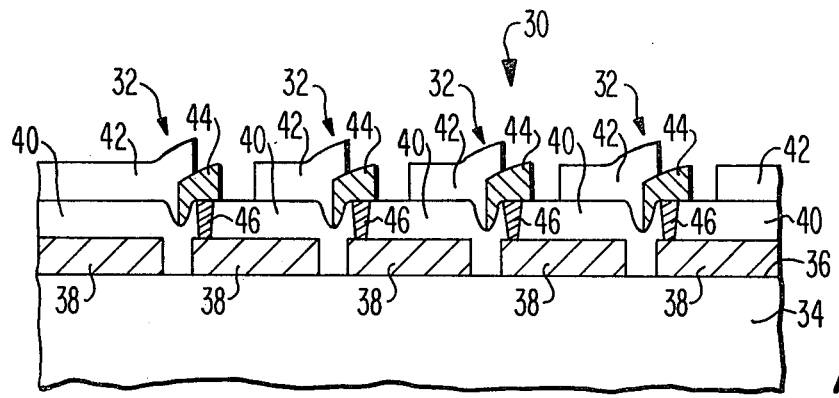
FIG. 5 illustrates a second embodiment of the solar cell of the present invention.

Referring now to FIG. 5, a second embodiment 30 of the present invention is shown. In this embodiment 30, a series of amorphous silicon solar cells 32 are connected in series similar to the manner heretofore described with reference to the first embodiment 10. The series connected amorphous silicon solar cells 32 are formed on an insulating substrate 34, which may be comprised of a transparent material, such as glass. On a surface 36 of the substrate 34 are a series of conductive electrodes 38 which may be comprised of either a metal or ITO, depending upon whether incident light is to reach the solar cells 32 from above the surface 36 or whether it is to travel through the substrate 34, either of which is contemplated by the present invention. Each of the solar cells 32 further comprises an amorphous silicon layer 40 which overlies the conductive electrodes 38. In addition, there are upper electrodes 42, which may be either metal or ITO for the reasons heretofore described. The upper electrodes 42 are electrically connected to the lower electrodes 38 of the next adjoining cell 32 through the use of metal stripes 44 and interelectrode contacts 46 in much the same manner as was heretofore described with reference to the first embodiment 10 of the invention.

Figure 6:
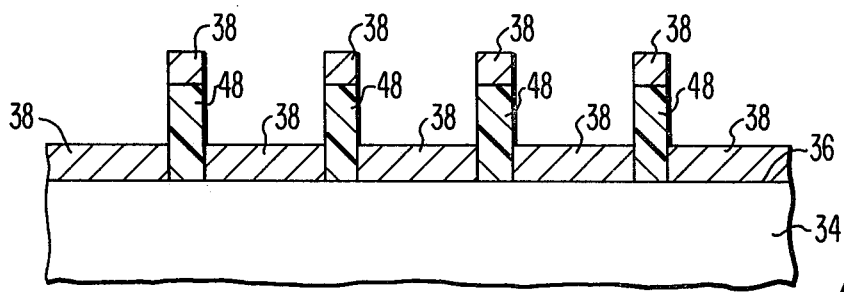
FIGS. 6–7 illustrate the method of manufacturing the solar cell of FIG. 5.

In order to manufacture the second embodiment 30 of the invention, one starts with a substrate 34, as shown in FIG. 6. On a surface 36 of the substrate 34 a series of stripes 48, such as photoresist or paint stripes, is applied. The paint stripes 48 used in the preferred embodiment of the invention are sprayed onto the surface 36 of the substrate 34 through a striped mask. Such paint stripes are relatively thick when compared to the materials typically used in amorphous silicon solar cells. Next, the material which will comprise the lower electrodes 38 is applied to the surface 36 of the substrate 34 and to the exposed surface of the stripes 48. In the case of ITO, the material is simply sprayed onto the surface of the strips 48 and the surface 36 of the substrate 34. In the case of a metal, the material can be sputtered or evaporated onto the surfaces. In view of the thickness of the stripes 48, the material 38 will not form a continuous layer due to the high step topology of the stripes 48. Accordingly, after the application of the material 38 the paint stripes 48 may be peeled from the surface 36 of the substrate 34. Thus, while a photolithographic process could have been used in order to accomplish the same result, and while such a photolithographic process is contemplated within the inventive concept, by using the "paint and peel" method just described, considerable time and labor, as well as expense, may be saved in the manufacture of the solar cell array 30.

Figure 7:
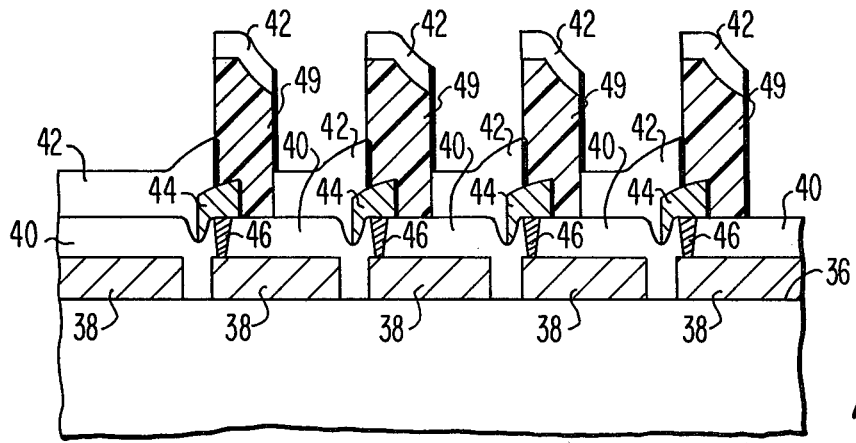

Referring now to FIG. 7, after the stripes 48 have been removed, an amorphous silicon layer 40 is applied over the surface of the structure in any suitable manner depending upon the particular structure desired. The manner of applying the amorphous silicon layer 40, and its composition, is more fully described in the U.S. patents which have heretofore been incorporated herein by reference. Next, metal stripes 44 are applied to the surface of the amorphous silicon layer 40 in any suitable manner, such as by evaporating through a striped mask. Then, the interelectrode connections 46 are formed by heating the structure in the manner heretofore described in order to cause the metal stripes 44 to spike through to the underlying electrodes 38.

Thereafter, the upper electrodes 42 are formed. The upper electrodes 42 may be formed by using a "paint and peel" method which entails first applying a series of paint stripes 49 in the manner heretofore described, and then applying the material which will comprise the upper electrodes 42 in the manner heretofore described. The material which comprises the upper electrodes 42 will be either a metal or ITO, and due to the abrupt topology of the paint stripes 49 it will be discontinuous for the reasons already discussed.

Following the application of the material which will comprise the upper electrodes 42, the paint stripes 49 along with the material 42 on their upper surface are removed through a peeling process whereby the structure of the array 30 shown in FIG. 5 will remain.

In accordance with the present embodiment of the invention, it is not necessary to do any scribing in the manufacture of the array 30, because a property of amorphous silicon is that it has virtually no lateral conduction. Therefore, an interesting aspect of a solar cell array 30 of the type described with reference to FIG. 5, is that it is not necessary to make the amorphous silicon layer 40 electrically discontinuous. Thus, while the laser scribing described with reference to the first embodiment 10, and shown in FIGS. 1 and 4 did cut through the amorphous silicon layer 20, such cutting is not required in order to form a solar cell array.

While the present invention has been described with reference to amorphous silicon solar cells, as will be obvious to those skilled in the art, the invention may be employed with other types of solar cells, including, but not limited to, single crystal, polycrystalline silicon, or microcrystalline silicon cells, or cadmium sulfide solar cells without departing from the spirit or scope of the invention. Accordingly, the term "amorphous silicon layer" as used herein is meant to include any type of semiconductor solar cell material which may be interconnected by spiking and which has a low lateral conductivity for the reasons discussed herein.

I claim:

1. A solar cell array comprising a plurality of adjacent, series connected solar cells on a single insulating substrate comprising
    (a) a plurality of spaced lower electrodes on a surface of the substrate;
    (b) a semiconductor layer comprising amorphous silicon over said lower electrodes and the surface of the substrate between the first electrodes;
    (c) a plurality of spaced upper electrodes on the upper surface of said semiconductor layer with each upper electrode overlying one of the lower electrodes to form a solar cell, and
    (d) interelectrode connection means electrically connecting the upper electrode of one solar cell to the lower electrode of the next adjacent solar cell comprising a metal stripe contacting the upper electrode and including a portion spiked completely through the semiconductor layer and contacting the lower electrode of the adjacent cell.

2. The solar cell array of claim 1 wherein said interelectrode connection comprises a spiked aluminum connection.

3. The solar cell array of claim 1 wherein said interelectrode connection comprises a spiked gold connection.

4. The solar cell array of claim 1 wherein said interelectrode connection comprises a spiked copper connection.

5. A solar cell array in accordance with claim 1 wherein the upper electrode of each cell has a portion which overlies a portion of the lower electrode of the adjacent cell and the metal stripe extends along and contacts the portion of the upper electrode which overlays the lower electrode of the adjacent cell.

6. A solar cell in accordance with claim 5 in which each of the metal stripes is directly on the upper surface of the semiconductor layer and each of the upper electrodes overlies its respective metal stripe.

7. A method of forming an array of series connected solar cells comprising the steps of:
    (a) forming a series of spaced-apart conductive lower electrodes on an insulating substrate;
    (b) forming a semiconductor layer comprising amorphous silicon on the conductive lower electrodes and said substrate;
    (c) forming a series of spaced-apart metal stripes on the upper surface of the semiconductor layer;
    (d) forming a series of spaced-apart upper electrodes on the upper surface of said semiconductor layer with each of said upper electrodes overlying one of said lower electrodes to form a cell and contacting one of the metal stripes; and
    (e) heating the array to diffuse the metal of the metal stripes completely through the semiconductor layer to form a metal spike which contacts the lower electrode of an adjacent cell and thereby connects the cells in series.

8. The method of claim 7 wherein said step of forming a series of conductive lower electrodes comprises forming a single conductive layer and then scribing it to make it electrically discontinuous.

9. The method of claim 7 wherein said step of forming a series of conductive upper electrodes comprises forming a single conductive layer and then scribing it to make it electrically discontinuous.

* * * * *